United States Patent
Lee (10) Patent No.: US 7,029,383 B2
(45) Date of Patent: Apr. 18, 2006

(54) POLISHING HEAD OF CHEMICAL MECHANICAL POLISHING APPARATUS

(75) Inventor: Sung-Choul Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 139 days.

(21) Appl. No.: 10/620,017

(22) Filed: Jul. 14, 2003

(65) Prior Publication Data

US 2004/0048553 A1    Mar. 11, 2004

(30) Foreign Application Priority Data

Sep. 11, 2002    (KR) .................... 10-2002-0054909

(51) Int. Cl.
  *B24B 29/02*  (2006.01)

(52) U.S. Cl. ..................... 451/289; 451/388; 451/398

(58) Field of Classification Search ..................... None
  See application file for complete search history.

(56) References Cited

U.S. PATENT DOCUMENTS

| 6,241,593 B1* | 6/2001 | Chen et al. ................. 451/288 |
| 6,336,846 B1* | 1/2002 | Park et al. ..................... 451/41 |
| 6,755,726 B1* | 6/2004 | Chen et al. ................. 451/398 |
| 2001/0013503 A1* | 8/2001 | Custer et al. ................. 216/38 |
| 2003/0181153 A1* | 9/2003 | Chen et al. ................. 451/398 |

FOREIGN PATENT DOCUMENTS

JP    2001-219368    *  8/2001

* cited by examiner

*Primary Examiner*—Timothy V. Eley
(74) *Attorney, Agent, or Firm*—Marger Johnson & McCollom, P.C.

(57) ABSTRACT

A polishing head of a wafer polishing apparatus includes a body, a center supporter installed in a center of the body, a perforated plate including an upper plate and a lower plate that is disposed below the center supporter and has a plurality of thru-holes, a membrane covering the perforated plate, and a moving member for moving the lower plate up and down. By moving the lower plate up and down, the polishing head forcibly recovers an elasticity of the membrane (especially at an edge portion of the membrane).

10 Claims, 8 Drawing Sheets

POLISHING HEAD OF CHEMICAL MECHANICAL POLISHING APPARATUS

CROSS REFERENCE TO RELATED APPLICATIONS

This application claims priority from Korean Patent Application No. 2002-54909, filed on Sep. 11, 2002, the contents of which are hereby incorporated by reference in their entirety for all purposes.

BACKGROUND OF THE INVENTION

1. Technical Field of the Invention

This disclosure generally relates to an apparatus for manufacturing semiconductor wafers and, more particularly, to a polishing head of a chemical mechanical polishing apparatus.

2. Description of the Related Art

Chemical mechanical polishing (CMP) is a global technique for planarizing ultra large-scale integrated circuits (ULSI). By continuously feeding slurry onto an abrasive pad, the CMP is carried out to remove a step difference of layers formed on a wafer surface. Generally, the CMP is performed once or twice during processes such as, for example, depositing, exposing, and etching.

In CMP, the rear surface of a wafer is fixed by a polishing head and the front surface thereof is pressed against an abrasive pad installed on a turntable. The polishing head may be rotated to provide additional movement between the wafer and the turntable.

An effective CMP process requires that a wafer surface is uniformly planarized even at a high polishing speed. Characteristics such as a planarity of a wafer surface to be polished and a polishing speed are strongly affected by a relative speed between a wafer and an abrasive pad and a force pressing the wafer against the abrasive pad. The stronger the wafer pressing force is, the higher the polishing speed becomes. For this reason, in the event that a non-uniform force is applied by the polishing head to the wafer, the relatively strongly pressed portions of the wafer surface are polished faster than the relatively weakly pressed portions thereof.

In the CMP process, polishing uniformity is dependent on head configuration. Thus, membrane-type heads of an excellent polishing uniformity have actively been developed and applied by CMP apparatus companies. Furthermore, equipment for regulating the CMP characteristics of a wafer edge portion is needed with the presence of large-diameter wafers.

The configuration of a polishing head in a typical CMP apparatus is now described below with reference to FIG. 1.

Figure 1:
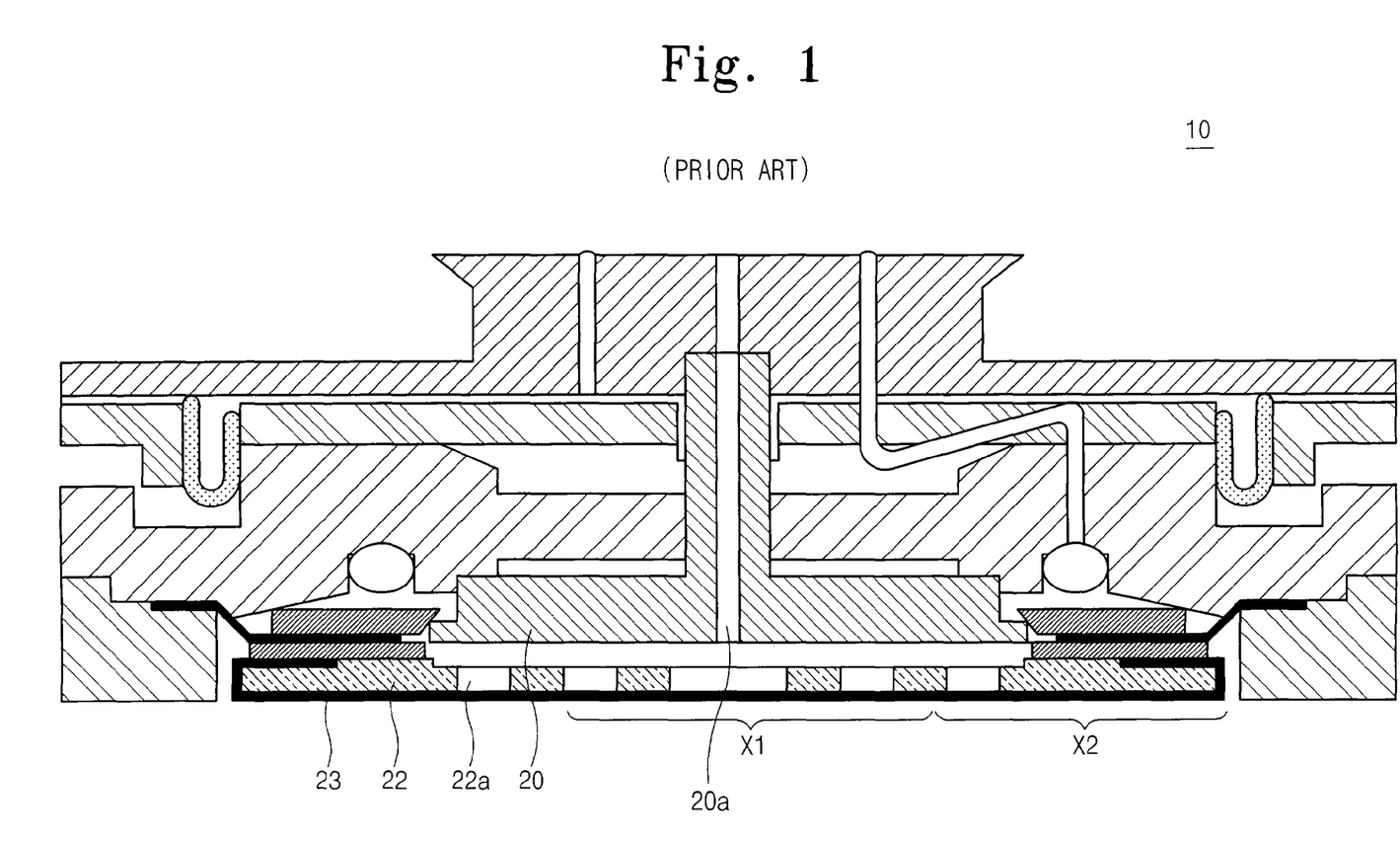
FIG. 1 is a cross-sectional drawing showing a configuration of a polishing head in a typical CMP apparatus.

Referring to FIG. 1, a polishing head 10 has a pressurizing structure in which only one pressure hole 20a is perpendicularly formed in a center support 20. When a gas pressure or a vacuum pressure is distributed throughout a membrane 23 via thru-holes 22a of a perforated plate 22, it is temporarily more lopsided toward an inner portion X1 of the membrane 123 than an edge portion X2 thereof, which is undesirable.

Due to the non-uniform pressurizing operation within a temporary time interval, the polishing uniformity is lowered and in particular a wafer edge slow phenomenon occurs. In other words, there is a slower polishing rate at the edge portion X2 of the wafer then at the inner portion X1.

The elasticity of the membrane 23 is also decreased by slurry. Specifically, the elasticity at the inner portion X1 is lowered more than that at the edge portion X2, which results in non-uniform expansion of the membrane. Due to the non-uniform expansion of the membrane, the wafer polishing uniformity is lowered and the wafer edge slow phenomenon occurs.

Embodiments of the invention address this and other limitations of the prior art.

SUMMARY OF THE INVENTION

Embodiments of the invention include a wafer polishing apparatus having a high polishing uniformity.

In some embodiments, a polishing head of a wafer polishing apparatus recovers an elasticity lowered at a membrane edge portion.

In other embodiments, a polishing head of a wafer polishing apparatus controls a wafer edge profile to prevent a wafer edge slow phenomenon.

DETAILED DESCRIPTION OF THE INVENTION

The invention will now be described in detail with reference to exemplary embodiments thereof as illustrated in the accompanying drawings. In the following description, numerous specific details are set forth in order to provide a thorough understanding of the present invention. However, it will be apparent to a person skilled in the art that the invention may be practiced without some or all of these specific details. In other instances, well known process steps have not been described in detail so not to unnecessarily obscure the present invention.

Figure 2:
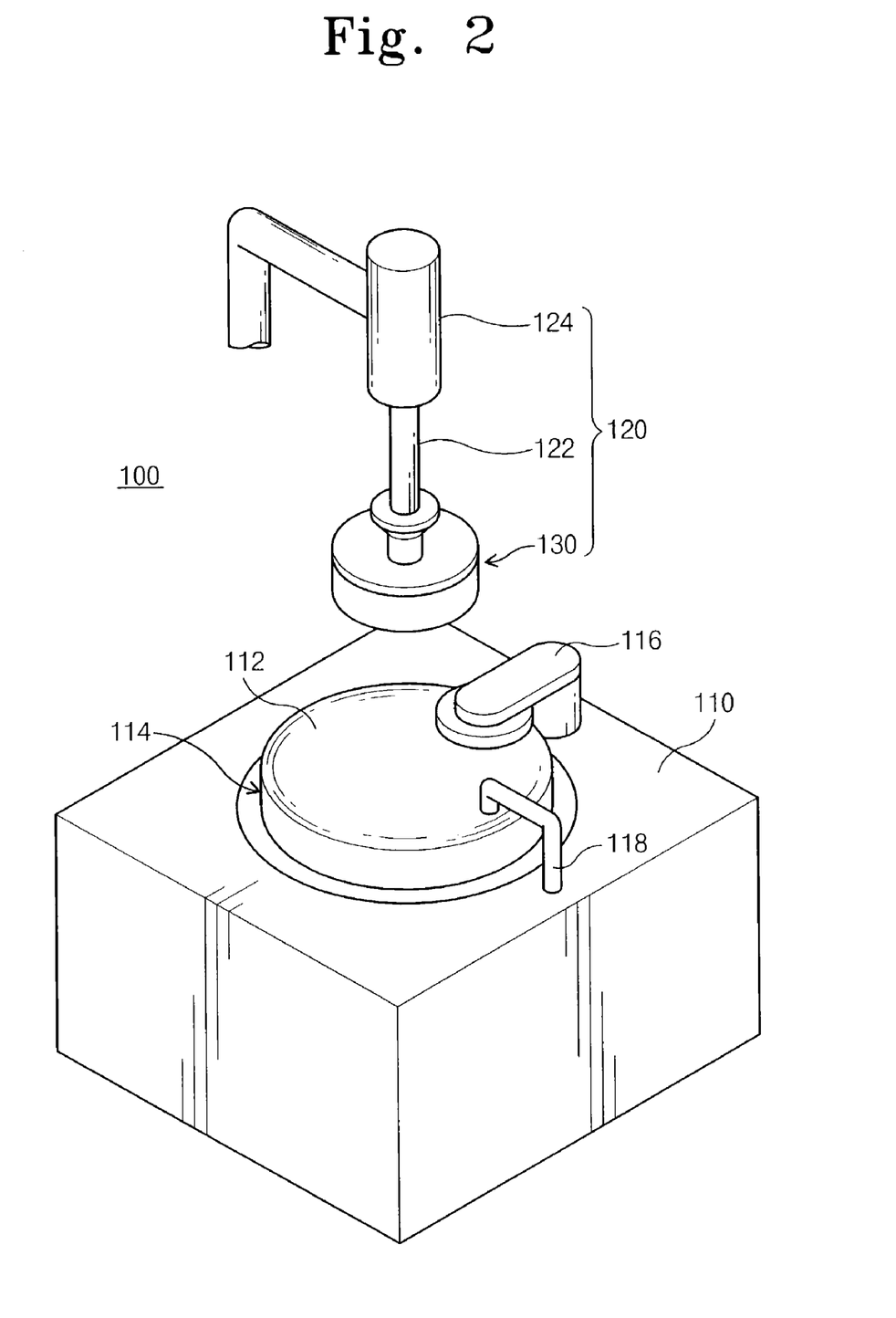
FIG. 2 is an exploded isometric drawing of a CMP apparatus according to an embodiment the invention.

FIG. 2 is an exploded isometric view of a CMP apparatus according to an embodiment the invention. Referring to FIG. 2, a CMP apparatus 100 includes a polishing station 110 and a polishing head assembly 120. A rotatable turntable 114 with an abrasive pad 112 (not shown) is located upon the polishing station 110.

The turntable 114 is connected to a turntable rotor (not shown) for spinning the turntable. During a polishing process, the rotor typically rotates the turntable 114 at a speed of 50–80 rpm, but the rotation speed of the turntable may be higher or lower. The abrasive pad 112 is made up of a composite material having an uneven polishing surface. The polishing station 110 includes typical pad conditioner 116 and slurry feeder 118 for feeding slurries onto the surface of the abrasive pad 112. The slurries contain a reaction reagent such as deionized water (DI water) for oxidation polishing, abrasive particles such as silicon dioxide (SiO2) for oxidation polishing, and a chemical reaction catalyst such as potassium hydroxide for oxidation polishing. The conditioner 116 and the slurry feeder 118 are well known in the art.

The polishing head assembly 112 includes a polishing head 130, a driving shaft 122, and a motor 124. The polishing head 130 serves to uniformly impose a downward pressure on a wafer and maintain the wafer in contact with the abrasive pad 112. The polishing head 130 is typically rotated at a speed of 40–70 rpm by means of the driving shaft connected to the motor 124, but the rotation speed of the polishing head 113 may be lower or higher. Furthermore, the polishing head 130 may be connected to at least two channels for supplying an air pressure for pushing the wafer or a vacuum pressure for capturing and holding the wafer. Each of the channels has a valve, a transducer, and a regulator.

The polishing head 130 is now described more specifically below with reference to FIG. 3 through FIG. 4B.

Figure 3:
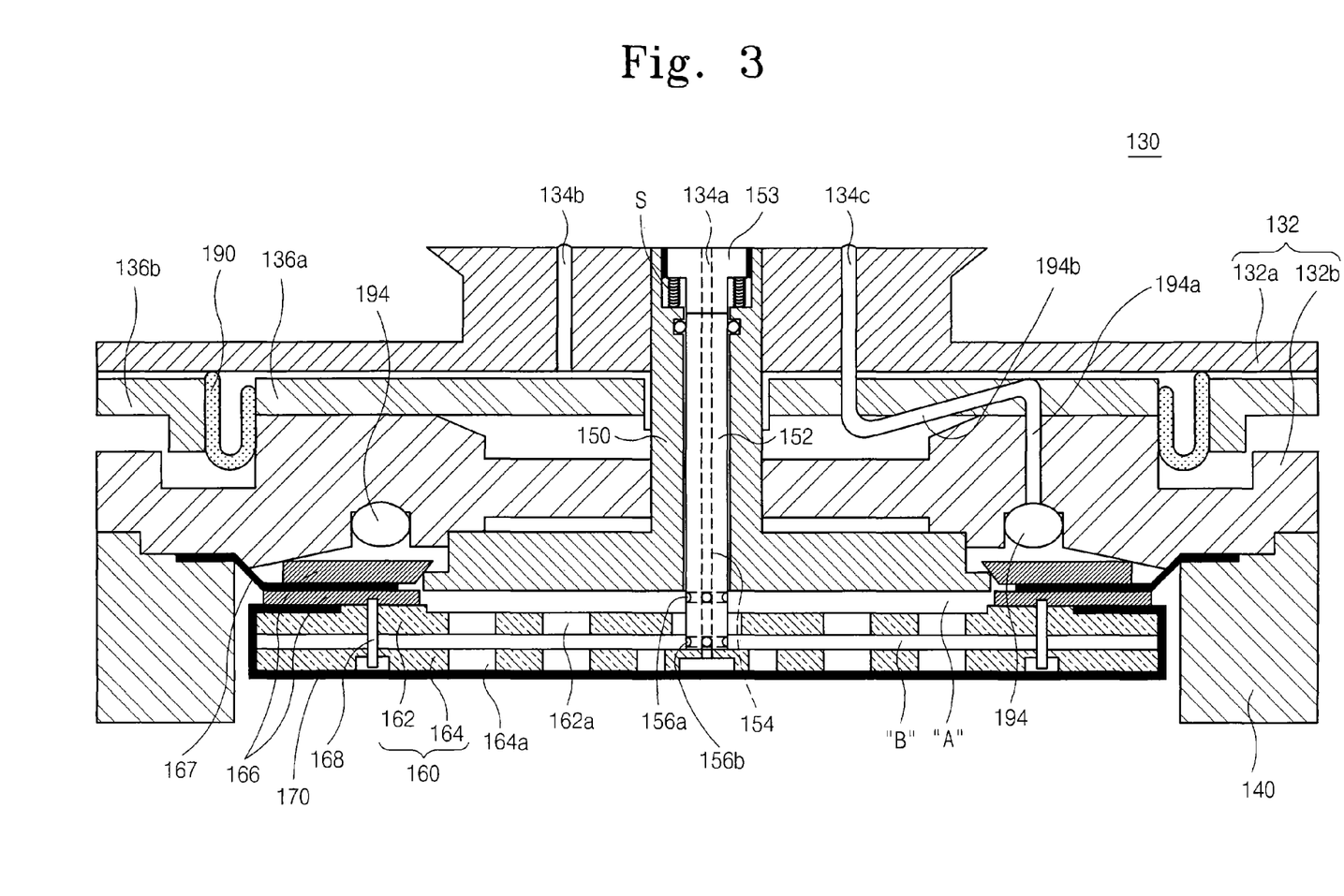
FIG. 3 is a cross-sectional drawing of a polishing head according to another embodiment of the invention.

Referring to FIG. 3, the polishing head 130 includes a body 132, a retainer ring 140, a center supporter 150, a moving shaft 152, a perforated plate 160, and a flexible membrane 170.

The body 132 is composed of an upper body (hereinafter referred to as "manifold"; 132a) and a lower body (hereinafter referred to as "carrier"; 132b).

The manifold 132a has a main pressure pipe 134a and a plurality of sub pressure pipes 134b and 134c, which are connected with gas supply channels (not shown). These pipes 134a, 134b, and 134c act as passages for transmitting a nitrogen ($N_2$) gas pressure, atmospheric pressure, or a vacuum pressure. Other gas pressures from different gases could be used as well. The manifold 132a and the carrier 132b are interconnected through an internal and external fixing plate 136a and 136b disposed therebetween. A diaphragm 190 is inserted into a space between the internal and external fixing plates 136a and 136b, sealing the space in order to prevent the leakage of nitrogen gas and pressing the retainer ring 140 by means of a gas pressure or a vacuum pressure transmitted through the sub pressure pipe 134b.

Another pressure pipe 194a is positioned to vertically communicate with the internal fixing plate 136a and the carrier 132b. An annular inner tube 194 is located below the carrier 132b to apply a constant pressure to an entire polishing head 130. The inner tube 194 is connected to the sub pressure pipe 134c through a pressure pipe 194a and a connection pipe 194b. A gas pressure or a vacuum pressure is transferred to the inner tube 194 through the interconnected pipes 194a and 194b.

The center supporter 150, which is called a gymbal, is located in the center of the manifold 132a and the carrier 132b to support a wafer. The perforated plate 160 is disposed under a horizontal part of the center supporter 150 and is divided into an upper plate 162 and a lower plate 164. Several thru-holes 162a and 164a are formed at the upper and lower plates 162 and 164, respectively. The upper plate 162 is coupled to one end of a flexure 167 by way of the fixing member 166. Here the other end of the flexure 167 is fixed to the carrier 132b.

Unlike the upper plate 162 that is tightly fixed, the lower plate 164 is highly probable to be bounded. Accordingly, fixing pins 168 are fixed to the fixing member 166 through the lower and upper plates 164 and 162 in order to prevent the bounding of the lower plate 164.

The membrane 170 is fixed to the upper plate 162 and is covered to enclose a bottom side of the lower plate 164. The membrane 170 applies a load to a thin rubber film that is in direct contact with the rear surface of a wafer. Under pressure, the membrane 170 is expanded to apply a load to the rear surface of the wafer.

A moving shaft 152 is perpendicularly disposed at a center of the center supporter 150. The moving shaft 152 serves to transmit a gas pressure or a vacuum pressure to the membrane 170 during/after a polishing process and to move the lower plate 164 in the up/down direction. The moving shaft 152 is connected with the lower plate 164. They may be manufactured monolithically or independently. The moving shaft 152 has a screw part 153 that is screw-coupled with the underlying center supporter 150. Rotation of the screw part 153 enables the moving shaft 152 to move the lower plate 164 in the up/down direction. When the lower plate 164 moves down, the membrane 170 is forcibly expanded by the lower plate 164, as shown in FIG. 4A. Particularly, an edge portion of the membrane 170 is more expanded than a central portion thereof. As the lower plate 164 moves down, a lowered elasticity of the membrane 170 (especially, at the edge portion of the membrane 170) is recovered. The membrane 170, which is forcibly expanded by the lower plate 164, is expanded by a pressure provided through the moving shaft 152, as shown in FIG. 4B.

The lower plate 164 of the polishing head 130 moves up and down to forcibly recover the elasticity of the membrane 170 (especially, at the edge of the membrane 170).

A spring S is installed between the screw and the center supporter 150 to maintain the fixed state of the screw part 153.

A pressure passage 154, which is demarcated by a dotted line, is formed to vertically penetrate the moving shaft 152. The pressure passage 154 communicates with the manifold 132a and the main input pipe 134a. First horizontal holes 156a and second horizontal holes 156b are formed at the moving shaft 152 to prevent a pressure from being applied to a central portion of the membrane 170 more strongly than to an edge portion thereof. These first and second horizontal holes 156a and 156b communicate with the pressure passage 154. The first horizontal holes 156a are located in a first space "A" that is positioned between the upper plate 162 and a horizontal part of the center supporter 150. The second horizontal holes 156b are located in a second space "B" that is positioned between the upper plate 162 and the lower plate 164.

A pressure (vacuum pressure or gas pressure) provided to the pressure passage 154 is provided to the first space "A" through the first horizontal holes 156a. Thereafter, the pressure provided to the first space "A" is temporarily provided to the second area "B" through second horizontal holes 156b. During a very short time, the pressure is provided to the first space "A" and the second space "B" in the order named. The pressure provided to the spaces "A" and "B" is uniformly applied throughout the membrane 170 (from an edge portion of the membrane 170 to a central portion thereof) via the thru-holes 162a and 164a.

A retainer ring 140 is installed at a lower edge of the carrier 132b. The retainer ring 140 operates to prevent a wafer from separating from the polishing head 130.

Under the state of being in contact with the entire surface of a wafer, the polishing head 130 is rotated on an abrasive pad 112 to start a polishing process. As indicated by arrows of FIG. 4B, a nitrogen gas pressure is provided from the main pressure pipe 134a of the manifold 132a to the first and second spaces "A" and "B" through the pressure passage 154 and the first and second horizontal 156a and 156b. The nitrogen gas pressure provided to these spaces "A" and "B" is uniformly applied throughout the membrane 170 via thru-holes of the upper/lower plates 162 and 164. Thereafter, a uniform pressure is applied to the rear surface of the wafer. The retainer ring 140 holds a circumference of the wafer to perform the polishing process without moving the wafer.

Accordingly, embodiments of the invention employ a pressurizing structure in which a pressure is uniformly provided through a plurality of horizontal holes 156a and 156b communicating with a vertical pressure passage 154 of a moving shaft 152 instead of a conventional pressurizing structure in which only one vertical pressure hole is formed in a center supporter. According to the conventional art, a gas pressure or a vacuum pressure is lopsidedly applied to the central portion of a membrane. But, according to the present invention, a gas pressure or a vacuum pressure is uniformly and simultaneously applied throughout the membrane 170 (to a central portion as well as an edge portion of the membrane 170).

Unlike a conventional perforated plate, a perforated plate according to embodiments of the invention include an upper plate and a lower plate. The upper plate is fixed, and the lower plate can move up and down together with a moving shaft. Further, a polishing head regulates an edge profile by moving the lower plate up and down to prevent an edge slow phenomenon.

A polishing head according to yet another embodiment of the present invention is now described below with reference to FIG. 5 and FIG. 6.

Figure 4A:
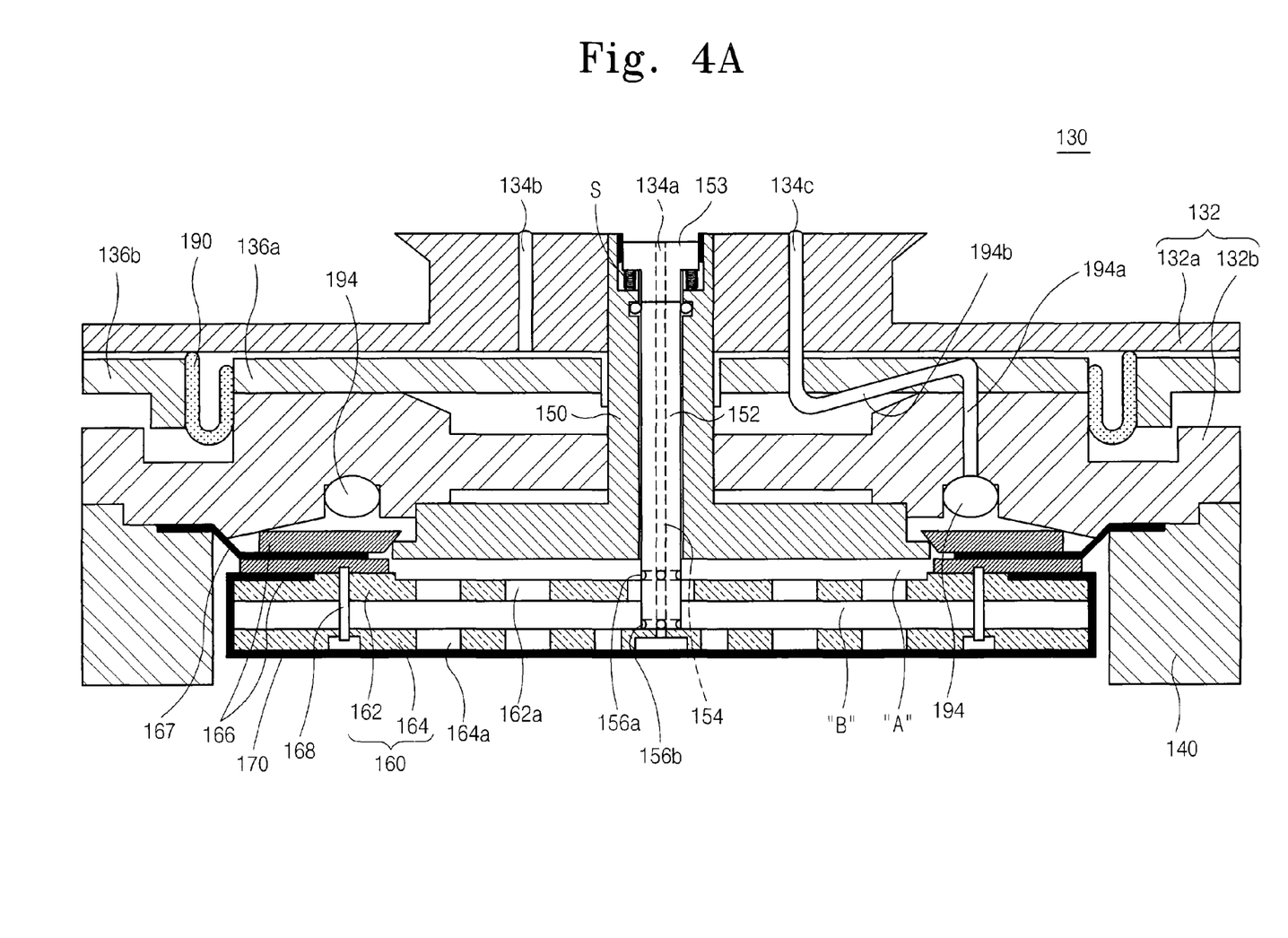
FIG. 4A is a cross-sectional drawing of the polishing head of FIG. 3 in which a lower plate moves.
Figure 4B:
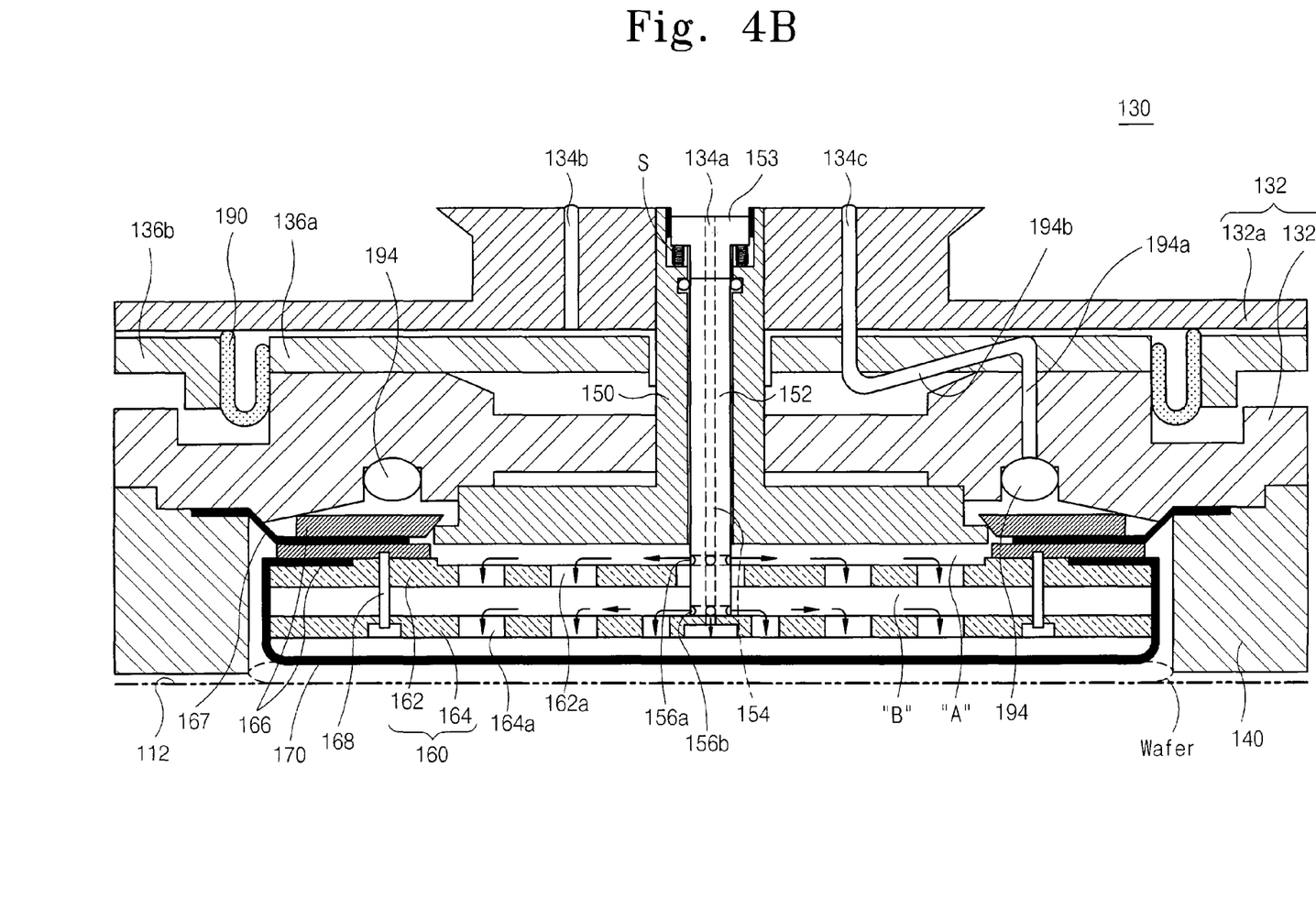
FIG. 4B is a cross-sectional drawing of the polishing head of FIG. 3 in which a membrane is expanded.
Figure 5:
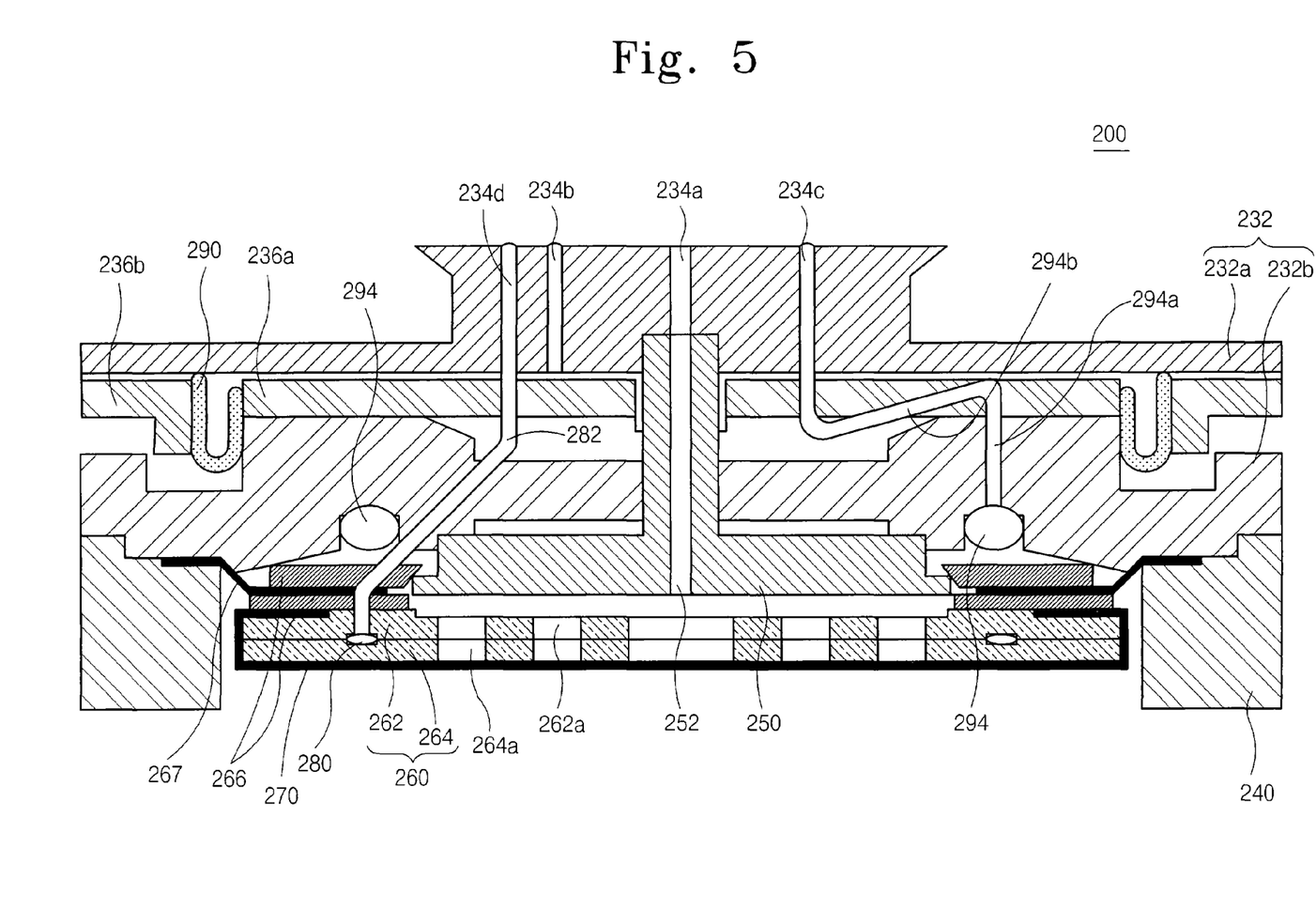
FIG. 5 is a cross-sectional drawing of a polishing head according to yet another embodiment of the present invention.

Referring to FIG. 5, unlike the polishing head 130 according to the embodiment of FIGS. 3 and 4, a polishing head 200 uses pressurizing means to move lower plate 264 up and down.

The polishing head 200 includes a body 232, a retainer ring 240, a center supporter 250, an elastic member 280, a perforated plate 260, and a flexible membrane 270.

The body 232 includes an upper body (hereinafter referred to as "manifold"; 232a) and a vessel-shaped lower body (hereinafter referred to as "carrier"; 232b).

The manifold 232a has a main pressure pipe 234a and a number of sub pressure pipes 234b, 234c, and 234d, which are connected to gas supply channels (not shown). The pipes 234a, 234b, 234c, and 234d act as passages for transmitting a nitrogen (N2) gas pressure. In alternate embodiments, they may transmit an atmospheric pressure or a vacuum pressure. And, as above, other gases could also be used. The manifold 232a and the carrier 232b are interconnected through internal and external fixing plate 236a and 236b therebetween. A diaphragm 290 is inserted into a space between the internal and external fixing plates 236a and 236b, sealing the space in order to prevent the leakage of nitrogen gas and pressing the retainer ring 140 by means of a gas pressure or a vacuum pressure transmitted through the sub pressure pipe 234b.

Another pressure pipe 294a is positioned to vertically communicate with the internal fixing plate 236a and the carrier 232b. An annular tube 194 is located below the carrier 232b to apply a constant pressure to an entire polishing head 200. The inner tube 294 is connected to the sub pressure pipe 234c through a pressure pipe 294a and a connection pipe 294b. A gas pressure or a vacuum pressure is transferred to the inner tube 294 through the interconnected pipes 294a and 294b.

The center supporter 250 is located in the center of the manifold 232a and the carrier 232b. The center supporter 250 serves to transfer a gas pressure or a vacuum pressure to the membrane 270 and to support a wafer.

A vertical pressure hole 252 is formed at the center supporter 250 to communicate with a main pressure pipe 234a of the manifold 232a. A perforated plate 260 sits below a horizontal part of the center supporter 250. The perforated plate 260 is divided into an upper plate 262 and a lower plate 264. A number of thru-holes 262a and 264a are formed at the upper and lower plates 262 and 264, respectively. The upper plate 262 is coupled to one end of a flexure 267 by way of the fixing member 266. Here the other end of the flexure 267 is fixed to the carrier 232b.

An annular tube 280 is installed between the upper and lower plates 262 and 264 to apply a uniform pressure to the lower plate 264. The annular tube 280 is connected with a sub pressure pipe 234d of the manifold 232a through a connection pipe 282. The annular tube 280 is shrunk or expanded by a gas pressure or a vacuum pressure transmitted through interconnected passages. Shrinkage and expansion of the tube 280 allows the lower plate 264 to move up and down.

Figure 6A:
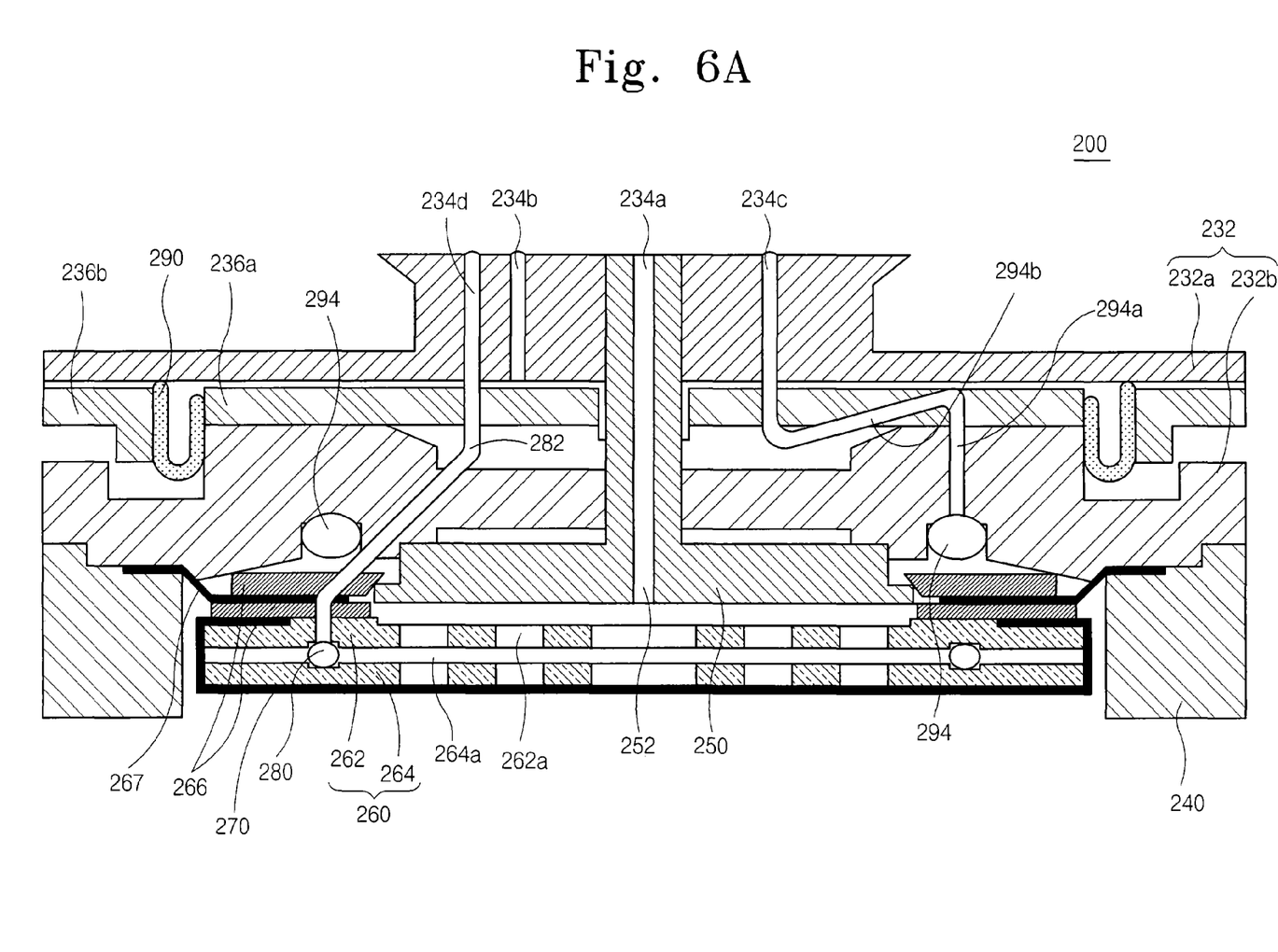
FIG. 6A is a cross-sectional drawing of the polishing head of FIG. 5 in which a lower plate moves.
Figure 6B:
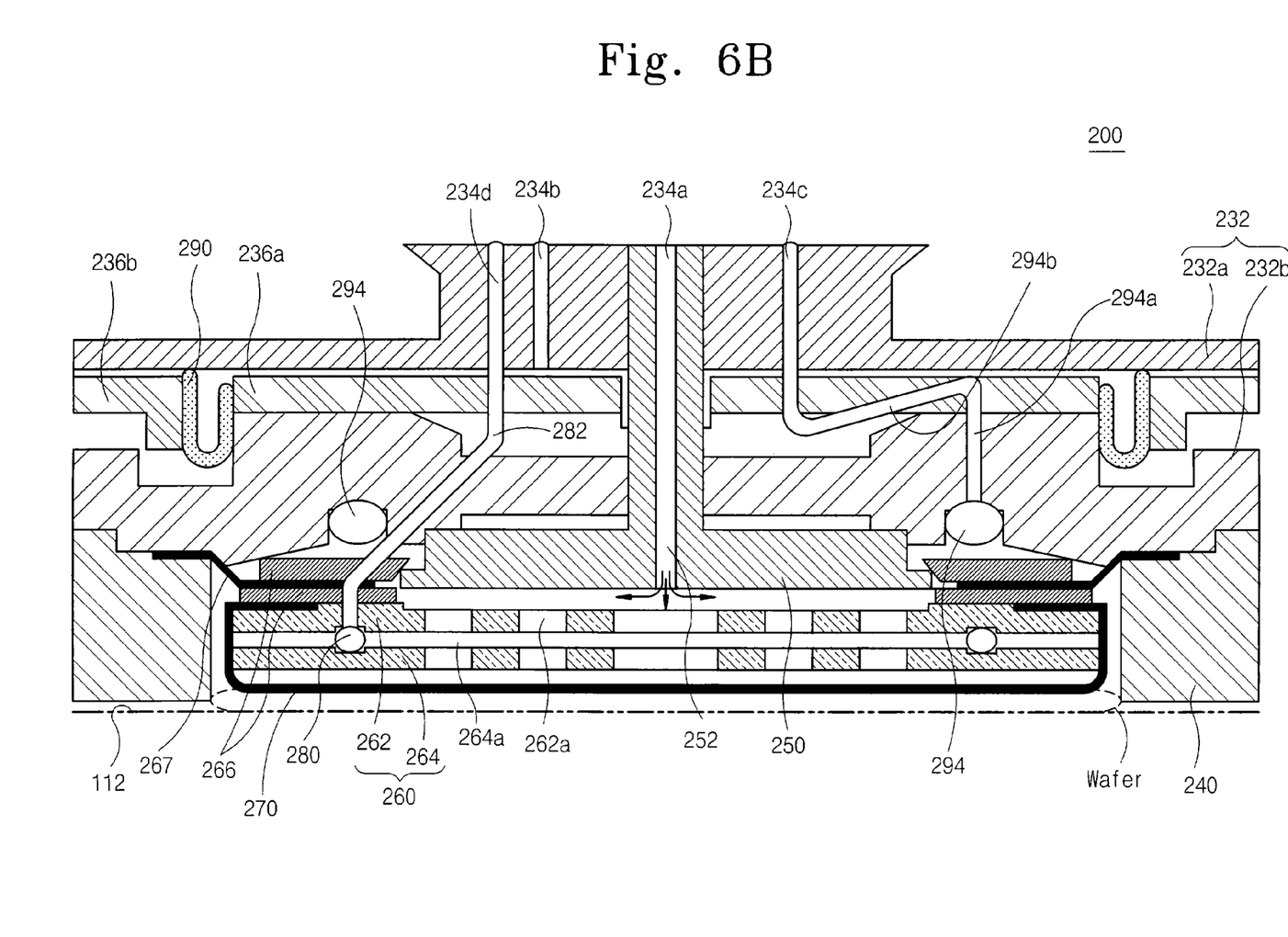
FIG. 6B is a cross-sectional drawing of the polishing head of FIG. 5 in which a membrane is expanded.

Referring to FIG. 6A, the membrane 270 is forcibly expanded by the lower plate 264 moving down. An edge portion of the membrane 270 is more expanded than a central portion thereof. Advantageously, the lower plate 264 moves down to recover a lowered elasticity of the membrane 270 (especially, at the edge portion of the membrane 270).

The lower plate 264 of the polishing head 200 moves up and down to forcibly recover the elasticity of the membrane 270 (especially at the edge of the membrane 270).

Furthermore, the polishing head 200 may control an edge profile by moving the lower plate 264 up and down.

According to this embodiment, movement of the lower plate 264 is controlled by a tube pressurization. That is, a pressure is regulated to control the up and down movement of the lower plate. Furthermore, a tube is shrunk and expanded to provide an independently controllable load to the edge portion of a wafer. By controlling the movements of the lower plate, a polishing head adjusts an edge profile of the wafer and prevents an edge slow phenomenon.

The polishing head 200 of FIG. 5 is similar in structure and operation to the polishing head 130 according of FIG. 3. Therefore, detailed description thereof will be omitted.

Specific embodiments of the invention will now be described in a non-limiting way.

Embodiments of the invention provide a polishing head of a wafer polishing apparatus. The polishing head can include a body, a center supporter installed in the center of the body, a perforated plate below the center supporter and having a plurality of thru-holes, a membrane covering the perforated plate, and a moving member for moving the perforated plate up/down. The perforated plate includes an upper plate fixed to the body and a lower plate moved up/down by the moving member. The lower plate is disposed under the upper plate.

The perforated plate further includes fixing pins for interconnecting the upper and lower plates to prevent bounding of the lower plate. The moving member is connected with the lower plate to move the lower plate up/down. The moving member includes an up/down movable shaft which is installed in the center supporter and is connected to the lower plate.

The up/down movable shaft includes an atmospheric pressure passage penetrating in a perpendicular direction, first supply holes for supplying an atmospheric pressure provided from the atmospheric pressure passage to a space between the upper plate and the center supporter, and second supply holes for supplying the atmospheric pressure provided from the atmospheric pressure passage to a space between the upper and lower plates. The first supply holes are connected to the atmospheric pressure passage, and the second supply holes are connected to the atmospheric pressure passage. The up/down movable shaft moves up/down like a screw.

Furthermore, some embodiments of the invention provide a polishing head of a wafer polishing apparatus. The polishing head has a body, a center supporter installed in a center of the body, a pair of upper/lower plates each having a plurality of thru-holes, a membrane for contacting and fixing a wafer by means of a gas pressure or a vacuum pressure provided through the thru-holes on the upper/lower plates, a moving member for moving the lower plate up/down. The upper/lower plates are disposed under the center supporter.

The upper plate is fixed to the body and the lower plate is disposed under the upper plate and is moved up/down by the moving member. The moving member includes an elastic member which is installed between the upper and lower plates and is expanded by an externally provided atmospheric pressure to move the lower plate up/down. The elastic member is disposed at an edge of the lower plate so as to apply a load to an edge of the wafer.

While some exemplary embodiments of the invention have been disclosed herein, it will be apparent to a person skilled in the art that various modifications and substitutes may be made without departing from the true spirit and scope of the invention. Therefore, the above description should not be taken as limiting the scope of the invention which is defined by the appended claims.

The invention claimed is:

1. A polishing head of a wafer polishing apparatus, comprising:
    a body;
    a center supporter disposed in a center of the body;
    an upper and a lower plate disposed under the center supporter, the upper plate and the lower plate each having thru-holes;
    a membrane fixed to the upper plate and disposed to enclose a lower surface of the lower plate, the membrane configured to uniformly expand when a gas pressure is applied through the thru-holes, the membrane configured to uniformly contract when a vacuum pressure is applied through the thru-holes; and
    a moving member for moving the lower plate up and down.

2. The polishing head as set forth in claim 1, wherein the upper plate is fixed to the body and the lower plate is disposed under the upper plate and is moved up and down by the moving member.

3. The polishing head as set forth in claim 1, wherein the moving member includes an elastic member which is installed between the upper and lower plates and is expanded by an externally provided gaseous pressure to move the lower plate up and down.

4. The polishing head as set forth in claim 3, wherein the elastic member is disposed at an edge of the lower plate so as to apply a load to an edge of the wafer.

5. A polishing head of a wafer polishing apparatus, the polishing head comprising:
    a body;
    a center supporter disposed in a center of the body;
    an upper and a lower plate disposed under the center supporter, the upper plate and the lower plate each having thru-holes;
    a membrane, the membrane configured to uniformly expand when a gas pressure is applied through the thru-holes, the membrane configured to uniformly contract when a vacuum pressure is applied through the thru-holes; and
    a moving member configured to move the lower plate upwards and downwards, the moving member including an elastic member, the elastic member disposed between the upper and lower plates and configured to move the lower plate responsive to an externally provided gaseous pressure.

6. The polishing head of claim 5, the elastic member further disposed at an edge of the lower plate and configured to apply a load to an edge of the wafer.

7. A wafer polishing apparatus that includes a polishing head, the polishing head comprising:
    a body;
    a supporter disposed within the body;
    a perforated plate affixed to the supporter, the perforated plate having thru-holes that pierce the perforated plate, the perforated plate including an upper plate and a lower plate; and
    a membrane affixed to an upper surface of the upper plate, the membrane enclosing a radially outer surface of the upper plate, a radially outer surface of the lower plate, and a lower surface of the lower plate, the membrane configured to uniformly expand when a gas pressure is applied to the membrane via the thru-holes, the membrane configured to uniformly contract when a vacuum pressure is applied to the membrane via the thru-holes.

8. The apparatus of claim 7, further comprising a moving member, the upper plate disposed in a fixed relationship with the body and the moving member configured to raise and lower the lower plate in relation to the upper plate.

9. The apparatus of claim 8, the moving member comprising an elastic member disposed between the upper and lower plates, the elastic member configured to raise and lower the lower plate responsive to an externally provided gaseous pressure.

10. The apparatus of claim 9, the elastic member disposed along a radially outer portion of the lower plate and configured to apply a load to a radially outer portion of a wafer disposed beneath the lower plate.

* * * * *